US011595010B2

United States Patent
Itabashi et al.

(10) Patent No.: US 11,595,010 B2
(45) Date of Patent: Feb. 28, 2023

(54) OPTICAL RECEIVER AND TRANSIMPEDANCE AMPLIFIER CIRCUIT

(71) Applicant: SUMITOMO ELECTRIC INDUSTRIES, LTD., Osaka (JP)

(72) Inventors: Naoki Itabashi, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 207 days.

(21) Appl. No.: 17/070,782

(22) Filed: Oct. 14, 2020

(65) Prior Publication Data

US 2021/0126602 A1    Apr. 29, 2021

(30) Foreign Application Priority Data

Oct. 24, 2019   (JP) .............................. JP2019-193430

(51) Int. Cl.
| | | |
|---|---|---|
| H03F 3/45 | (2006.01) | |
| H04B 10/69 | (2013.01) | |
| H03F 1/08 | (2006.01) | |
| H03G 3/30 | (2006.01) | |

(52) U.S. Cl.
CPC ......... H03F 3/45179 (2013.01); H03F 1/086 (2013.01); H03G 3/3084 (2013.01); H04B 10/691 (2013.01)

(58) Field of Classification Search
CPC ................. H03F 3/45179; H03F 1/086; H03F 2200/435; H03F 3/082; H03F 2200/451; H03F 3/193; H03F 2203/45392; H03F 2203/45658; H03F 3/45183;

(Continued)

(56) References Cited

U.S. PATENT DOCUMENTS 6,275,541 B1   8/2001 Nagahori et al.
7,418,213 B2 *  8/2008 Denoyer .................. H03F 1/26
                                          250/214 C (Continued)

FOREIGN PATENT DOCUMENTS

| JP | H11-008522 | 1/1999 |
| JP | 2009-49488 | 3/2009 |
| JP | 2012-004954 | 1/2012 |

*Primary Examiner* — Seung C Sohn
(74) *Attorney, Agent, or Firm* — Smith, Gambrell & Russell, LLP.

(57) ABSTRACT

An optical receiver disclosed includes a bias terminal, an input terminal, a photodiode, an amplifier circuit, a first resistor, a bypass circuit, a filter circuit, and a control circuit. The photodiode receives a bias from the filter circuit through the bias terminal, and outputs a current signal to the amplifier circuit through the input terminal. The amplifier circuit converts an input current to an output voltage. The bypass circuit electrically connected to the input terminal decreases a first input impedance viewed from the input terminal, when activated, and increases the first input impedance, when deactivated. The filter circuit increases a second input impedance viewed from the bias terminal, when a dumping function thereof is activated, and decreases the second input impedance, when the dumping function is deactivated. The control circuit activates the dumping function and the bypass circuit, when the output voltage is larger than a certain voltage.

6 Claims, 11 Drawing Sheets

(58) Field of Classification Search
CPC ...... H03G 3/3084; H03G 5/16; H04B 10/691; H04B 10/693; H04B 10/697
See application file for complete search history.

(56) References Cited

U.S. PATENT DOCUMENTS

| | | | |
|---|---|---|---|
| 7,868,701 B2 * | 1/2011 | Nakamura | H03G 1/0088 330/308 |
| 2010/0283542 A1 | 11/2010 | Shivaram et al. | |
| 2011/0311232 A1 | 12/2011 | Morita et al. | |

* cited by examiner

OPTICAL RECEIVER AND TRANSIMPEDANCE AMPLIFIER CIRCUIT

CROSS REFERENCE TO RELATED APPLICATIONS

The present application claims priority based on Japanese Patent Application No. 2019-193430, which is filed on Oct. 24, 2019, the entire content disclosed in the aforementioned Japanese patent applications being incorporated herein by reference.

TECHNICAL FIELD

The present disclosure relates to an optical receiver and a transimpedance amplifier circuit used in an optical receiver.

BACKGROUND

In an optical receiver, for example, a photodiode receives an optical signal from an external optical waveguide (for example, an optical fiber) and converts the optical signal into a photocurrent. For example, the cathode of the photodiode receives a bias voltage from a power supply through a filter circuit, and the anode of the photodiode outputs the photocurrent to a transimpedance amplifier (TIA). The photodiode is connected to the filter circuit and the TIA through bonding wires or signal wirings. A bonding wire has a parasitic inductance, and a signal wiring has a parasitic capacitance. Such a parasitic inductance and a parasitic capacitance can cause a resonance phenomenon in the circuit including the photodiode, the filter circuit, and the TIA. A resonance phenomenon affects various electrical characteristics such as gain bandwidth and group delay of the optical receiver, and deteriorates frequency response characteristics of the optical receiver.

SUMMARY

The present disclosure provides an optical receiver and a transimpedance amplifier circuit. The optical receiver includes a bias terminal, an input terminal, a photodiode, an amplifier circuit, a first resistor, a bypass circuit, a filter circuit, and a control circuit. The photodiode has an anode and a cathode. The anode is electrically connected to the input terminal and the cathode is electrically connected to the bias terminal. The photodiode is configured to convert an optical signal to a current signal. The amplifier circuit has an input and an output. The amplifier circuit is configured to receive an input current through the input and convert the input current to an output voltage. The amplifier circuit is configured to output the output voltage from the output. The first resistor is electrically connected between the input and output of the amplifier circuit. The bypass circuit is electrically connected to the input terminal. The bypass circuit is configured to decrease a first input impedance of the bypass circuit viewed from the input terminal and subtracts a portion of the current signal from the current signal, when the bypass circuit is activated by a first control signal. The bypass circuit is configured to increase the first input impedance, when the bypass circuit is deactivated by the first control signal. The filter circuit is electrically connected to the bias terminal. The filter circuit is configured to increase a second input impedance of the filter circuit viewed from the bias terminal, when a damping function of the filter circuit is activated by a second control signal. The filter circuit is configured to decrease the second input impedance, when the damping function of the filter circuit is deactivated by the second control signal. The control circuit is configured to generate the first control signal and the second control signal for activating the filter circuit when the control circuit activates the bypass circuit in accordance with the output voltage and for deactivating the filter circuit when the control circuit deactivates the bypass circuit in accordance with the output voltage.

The transimpedance amplifier circuit includes a bias terminal, an input terminal, an amplifier circuit, a first resistor, a bypass circuit, a filter circuit, and a control circuit. The bias terminal is configured to be electrically connected to a cathode of an external photodiode. The input terminal is configured to be electrically connected to an anode of the external photodiode and receive a current signal from the external photodiode. The amplifier circuit has an input and an output. The amplifier circuit is configured to receive an input current through the input and convert the input current to an output voltage, and configured to output the output voltage from the output. The first resistor is electrically connected between the input and output of the amplifier circuit. The bypass circuit is electrically connected to the input terminal the bypass circuit is configured to decrease a first input impedance of the bypass circuit viewed from the input terminal and subtract a portion of the current signal from the current signal, when the bypass circuit is activated by a first control signal, and configured to increase the first input impedance, when the bypass circuit is deactivated by the first control signal. The filter circuit is electrically connected to the bias terminal. The filter circuit is configured to increase a second input impedance of the filter circuit viewed from the bias terminal, when a damping function of the filter circuit is activated by a second control signal, and configured to decrease the second input impedance, when the damping function is deactivated by the second control signal. The control circuit is configured to generate the first control signal and the second control signal for activating the damping function of the filter circuit when the control circuit activates the bypass circuit in accordance with the output voltage and for deactivating the damping function of the filter circuit when the control circuit deactivates the bypass circuit in accordance with the output voltage.

BRIEF DESCRIPTION OF THE DRAWINGS

The above and other objects, features and advantages will become more apparent from the following detailed description of the preferred embodiments with reference to the accompanying drawings.

DETAILED DESCRIPTION

Figure 1:
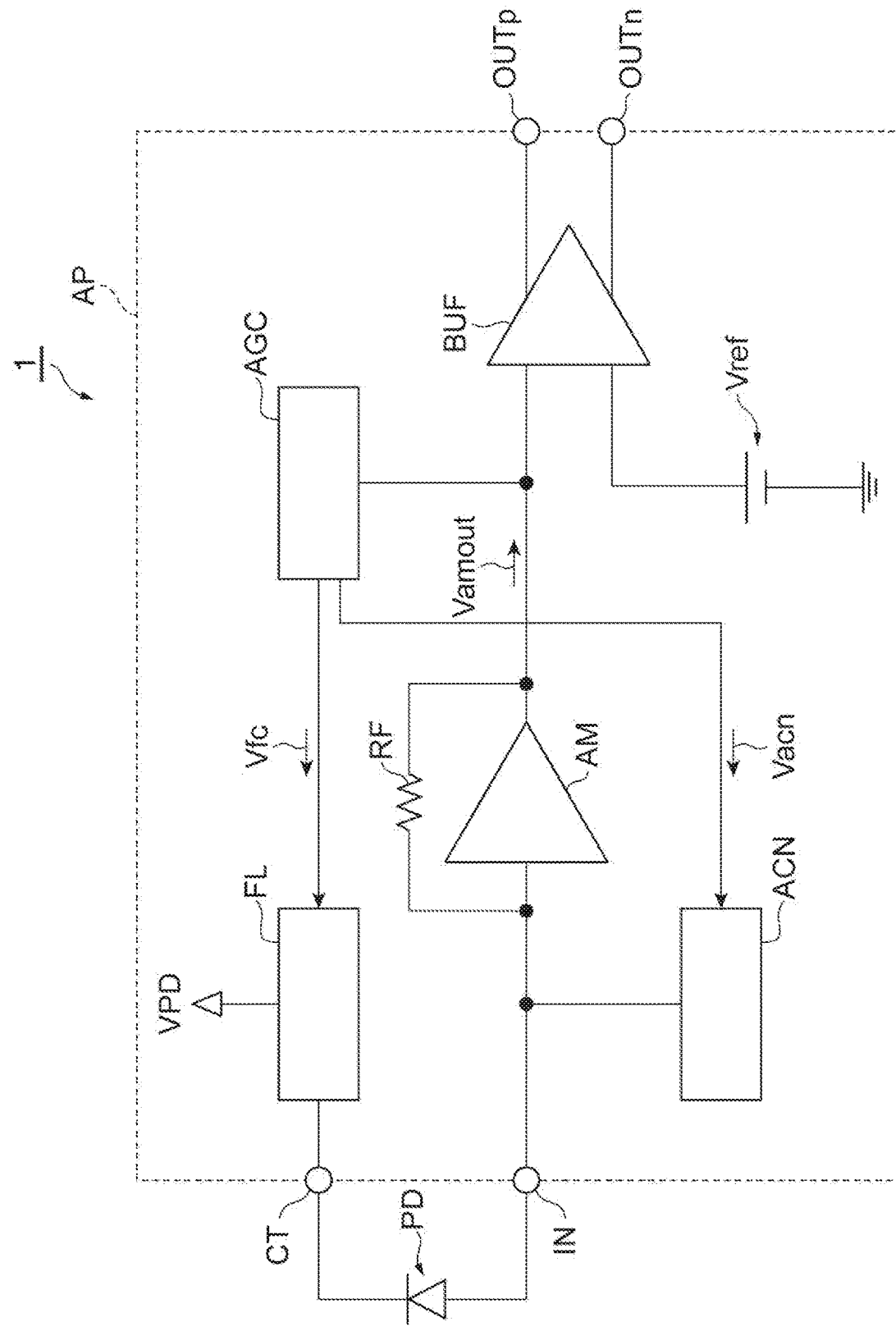
FIG. 1 is a diagram illustrating a configuration of an optical receiver according to one exemplary embodiment.

A TIA receiving the photocurrent from the photodiode, in order to maintain a linearity between an input current (photocurrent) and an output voltage of the TIA, performs a control in which amplitude of the input current is reduced by bypassing a portion of the input current from an input of the TIA. The control is a feedback control performed, for example, in accordance with amplitude of the output voltage output from the TIA, and is called AGC (Automatic Gain Control). In particular, when an AGC bypasses a portion of an AC component of the current input, input impedance of the TIA can be reduced. There is a possibility that such reduced input impedance may cause the resonance phenomenon described above. The present disclosure provides a stabilizing technique against the resonance phenomenon.

Specific examples of an optical receiver according to embodiments of the present disclosure will be described hereinafter with reference to the drawings. The present disclosure is not limited to these exemplifications. It is intended that the present invention is defined by the claims and includes all changes within the meaning and range equivalent to the claims. Incidentally, the same reference numerals denote the same or corresponding parts in the drawings.

FIG. 1 is a diagram illustrating a configuration of an optical receiver according to one exemplary embodiment. The optical receiver 1 includes a photodiode PD, and a transimpedance amplifier (TIA) circuit AP. The TIA circuit AP includes a bias terminal CT, an input terminal IN, a filter circuit FL, an amplifier circuit AM, a resistor RF (first resistor), a bypass circuit ACN, and a control circuit AGC. The TIA circuit AP further includes an output circuit BUF. The resistor RF may have a resistance value of, for example, several hundred like 400, 800 [Ω].

The Photodiode PD is electrically connected to the TIA circuit AP. More specifically, the anode of the photodiode PD is electrically connected to an input of the amplifier circuit AM through the input terminal IN of the TIA circuit 1. The input terminal IN is electrically connected to the anode of the photodiode PD.

The cathode of the photodiode PD is electrically connected to the filter circuit FL through the bias terminal CT of the TIA circuit 1. The bias terminal CT is electrically connected to the cathode of the photodiode PD. A bias voltage is necessary for operation of the photodiode PD. The bias terminal CT supplies the bias voltage to the photodiode PD. The photodiode PD is reverse biased by the bias voltage. The photodiode PD receives an optical signal from an external optical waveguide (for example, an optical fiber) and converts the optical signal into a photocurrent (current signal). The current signal Ipd is input to the input terminal IN of the TIA circuit AP.

The bypass circuit ACN is electrically connected to the input of the amplifier circuit AM. The bypass circuit ACN is electrically connected to the control circuit AGC. The bypass circuit ACN has a bypass function to reduce amplitude of an AC component (input current) of the current signal Ipd input to the amplifier circuit AM. For example, a portion of the AC component of the current signal Ipd input to the input terminal IN separately flows into the bypass circuit ACN as a bypass current Iacn. That is, the bypass circuit allows the AC component (input current) input to the amplifier circuit AM to be reduced than the AC component of the current signal Ipd input to the input terminal IN, by subtracting the bypass current Iacn from the current signal Ipd.

The bypass circuit ACN is activated or deactivated in response to a gain control voltage Vacn (first control signal) output from the control circuit AGC. For example, when the bypass circuit ACN is activated, the bypass current Iacn flows into the bypass circuit so that the input current Iin input to the amplifier circuit AM is reduced than the current signal input to the input terminal IN. When the bypass circuit ACN is deactivated, the bypass current Iacn hardly flows into the bypass circuit ACN. Accordingly, the input current Iin becomes substantially equal to the current signal Ipd.

Figure 11:
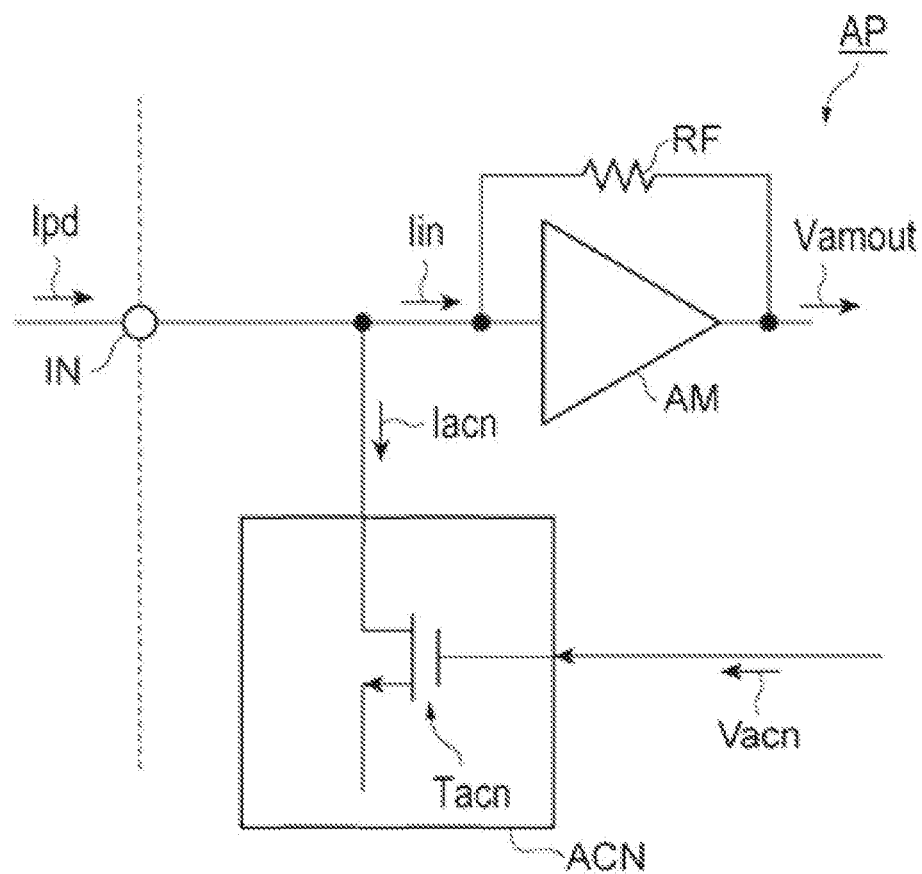
FIG. 11 is a diagram showing an example of a specific configuration of the bypass circuit shown in FIG. 1.

The bypass circuit ACN may include, for example, a Metal-Oxide-Semiconductor Field Effect Transistor (MOSFET) Tacn shown in FIG. 11 to implement the bypass function. In this case, for example, the drain of the MOSFET Tacn is electrically connected to the input of the amplifier circuit AM, and the gate of the MOSFET Tacn is electrically connected to the control circuit AGC. Incidentally, since the input of the amplifier circuit AM is electrically connected to the input terminal IN, the drain of the FET Tacn is electrically connected also to the input terminal IN. The source of the MOSFET Tacn is electrically connected to ground, or a static potential, for example. The gate of the MOSFET Tacn receives, for example, the gain control voltage Vacn from the control circuit AGC.

When the MOSFET Tacn of the bypass circuit ACN is turned on by setting the gain control voltage Vacn larger than a threshold voltage of the MOSFET Tacn, a portion of the AC component of the current signal Ipd input through the input terminal IN from the photodiode PD flows into the bypass circuit ACN as the bypass current Iacn. Thus, the input current Iin input to the amplifier circuit AM has amplitude smaller than amplitude of the current signal Ipd. In this case, the bypass function of the bypass circuit ACN is activated. At this time, for example, an on-resistance between the drain and the source of the MOSFET Tacn becomes comparable to input impedance (first input impedance) of the amplifier circuit Am, and input impedance (first input impedance) of the bypass circuit ACN viewed from the input terminal IN is reduced. The input impedance of the bypass circuit can be varied by adjusting the gain control voltage Vacn. Decreasing of the on-resistance of the bypass circuit increases the bypass current Iacn. As the bypass circuit is connected in parallel to the amplifier circuit AM, the input impedance of the input terminal IN viewed from the photodiode PD becomes relatively lower than when the bypass function is deactivated.

When the MOSFET Tacn of the bypass circuit ACN is turned off by setting the gain control voltage Vacn smaller than the threshold voltage of the MOSFET Tacn, the current signal Ipd input to the input terminal IN from the anode terminal of the photodiode PD is straight input to the amplifier circuit AM, because the bypass current Iacn hardly flows into the bypass circuit ACN. In this case, the bypass function of the bypass circuit ACN is deactivated. At this time, since the resistance between the drain and source of the MOSFET Tacn becomes a high resistance value of several tens KΩ or more, and the input impedance (first input impedance) of the bypass circuit ACN viewed from the input terminal IN becomes larger than the input impedance of the amplifier circuit Am. The input impedance of the input terminal IN viewed from the photodiode PD becomes relatively higher than when the bypass function is activated.

With respect to a resonance phenomenon due to a parasitic inductance and a parasitic capacitance in a circuit including the photodiode PD, the resonance phenomenon can be suppressed when the input impedance of the TIA circuit AP is increased, although the resonance phenomenon may not be sufficiently suppressed when the input impedance of the TIA circuit AP is decreased. Therefore, even if the resonance phenomenon is effectively suppressed while the bypass function is deactivated, the suppression of the resonance phenomenon may be ineffective when the bypass function is activated.

The filter circuit FL is electrically connected to a power supply VPD or a bias circuit supplying the bias voltage required for operation of the photodiode PD. The filter circuit FL includes a low pass filter, and stabilizes the bias voltage. The bias voltage is supplied to the photodiode PD through the bias terminal CT. The filter circuit FL is further electrically connected to the control circuit AGC. The filter circuit FL has a damping function to suppress the resonance phenomenon in the circuit including the photodiode PD. For example, the circuit including the photodiode PD further includes bonding wires connected to the photodiode PD, a signal wiring between the photodiode and the filter circuit FL, and a signal wiring between photodiode and the amplifier circuit AM. The resonance phenomenon here is, for example, a so-called LC resonance, which is caused by parasitic inductances of the bonding wires and parasitic capacitances of the signal wirings described above. The damping function of the filter circuit FL is activated or deactivated in response to a filter control voltage Vfc (second control signal) output from the control circuit AGC. The damping function will be described later.

The control circuit AGC is electrically connected to, for example, an output of the amplifier circuit AM, the filter circuit FL, and the bypass circuit ACN. The control circuit AGC controls the filter circuit FL and the bypass circuit ACN in accordance with an output voltage Vamout (output signal) of the amplifier circuit AM.

Specifically, when the control circuit AGC activates the bypass circuit ACN and the bypass function thereof by varying the gain control voltage Vacn in accordance with the output voltage Vamout (output signal) of the amplifier circuit AM, the control circuit AGC activates the damping function of the filter circuit FL by varying the filter control voltage Vfc.

When the control circuit AGC deactivates the bypass circuit ACN and the bypass function thereof by varying the gain control voltage Vacn in accordance with the output voltage Vamout (output signal) of the amplifier circuit AM, the control circuit AGC deactivates the damping function of the filter circuit FL by varying the filter control voltage Vfc.

The output circuit BUF can be, for example, a differential amplifier. The output circuit BUF has a pair of inputs. One of the inputs of the output circuit BUF is electrically connected to, for example, the output of the amplifier circuit AM, and the other of the inputs of the output circuit BUF is electronically connected to, for example, a DC power supply circuit Vref. The DC power supply circuit Vref supplies, for example, a reference voltage. The paired inputs of the output circuit BUF constitute a differential input. The output circuit BUF has a pair of outputs. One of the outputs of the output circuit BUFs is electrically connected to an output terminal OUTp. The other of the outputs of the output circuit BUF is electrically connected to an output terminal OUTn. The output circuit BUF amplifies a voltage difference (differential voltage) between the paired inputs, and outputs the amplified voltage difference (amplified differential voltage) as a voltage difference (differential voltage) between the paired outputs. The paired output constitute a differential output.

Incidentally, the TIA circuit AP may further have a gain variable amplifier circuit between the amplifier circuit AM and the output circuit BUF.

Figure 2:
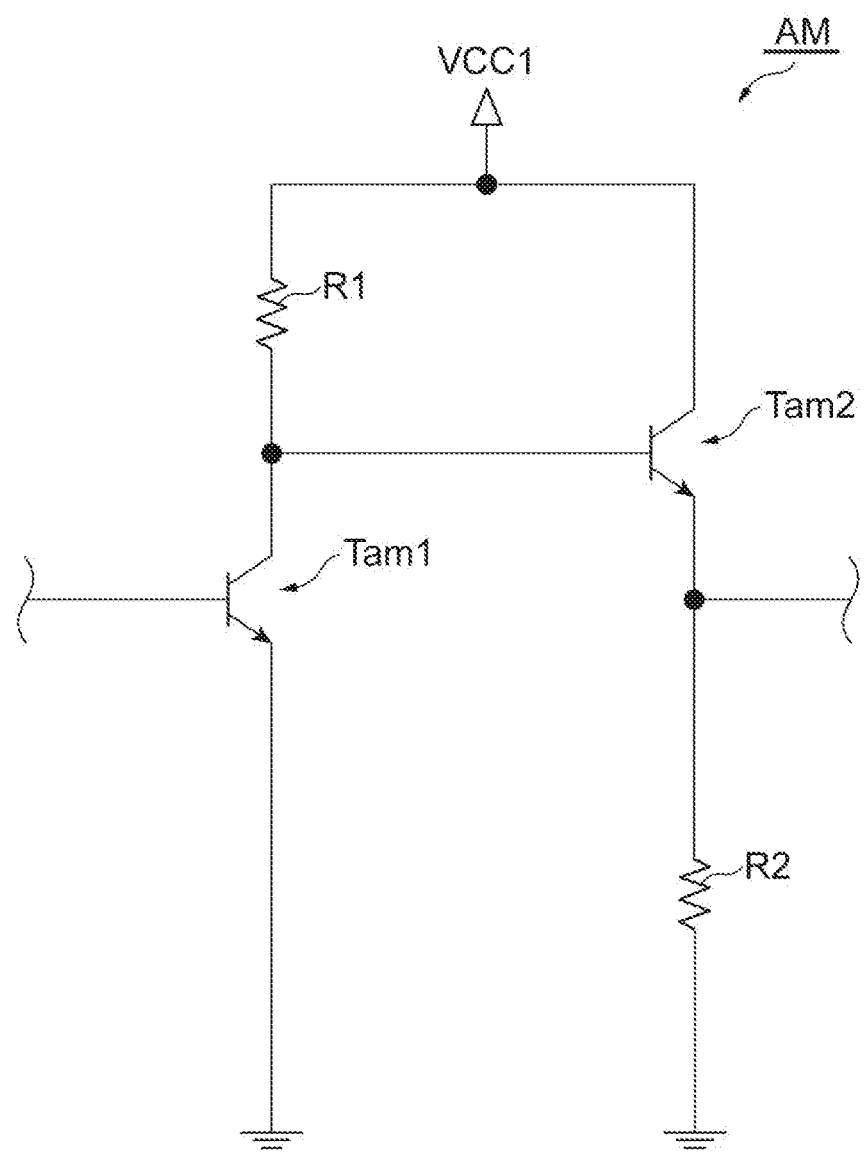
FIG. 2 is a diagram showing an example of a specific configuration of the amplifier circuit shown in FIG. 1.

FIG. 2 is a diagram showing an example of a circuit configuration of the amplifier circuit AM. The amplifier circuit AM is, for example, an inverting amplifier circuit. The amplifying circuit AM includes a transistor Tam1 and the transistor Tam2, and a resistor R1 and a resistor R2. The transistor Tam1 and transistor Tam2 can be, for example, NPN-type bipolar transistors. Each of the resistor R1 and the resistor R2 may have a resistance value of several hundred, for example, 300 [$\Omega$].

The base of the transistor Tam1 is electrically connected to the input terminal IN. The emitter of the transistor Tam1 is, for example, grounded. The collector of the transistor Tam1 is electrically connected to the base of the transistor Tam2. The collector of the transistor Tam1 is electrically connected to a power supply VCC1 through the resistor R1.

The collector of the transistor Tam2 is electrically connected to the power supply VCC1. The emitter of the transistor Tam2 is grounded through the resistor R2. The transistor Tam2 and the resistor R2 constitute an emitter follower circuit. The emitter of the transistor Tam2 is electrically connected to the control circuit AGC and the differential input of the output circuit BUF. The output voltage Vamout is output from the emitter of the transistor Tam2. For example, increasing of the gate voltage of the transistor Tam1 (i.e., the input voltage of the amplifier circuit AM) increases a collector current of the transistor Tam1, and decreases voltage of the collector (collector voltage) of the transistor Tam1. The collector voltage of the transistor Tam1 is level-shifted to a lower potential side by the emitter follower circuit, and the level-shifted collector voltage is output as the output voltage Vamout. Therefore, when the input voltage of the amplifier circuit AM increases (rises), the output voltage Vamout decreases. Conversely, when the input voltage of the amplifier circuit AM is decreased, the output voltage Vamout increases (rises).

Figure 3:
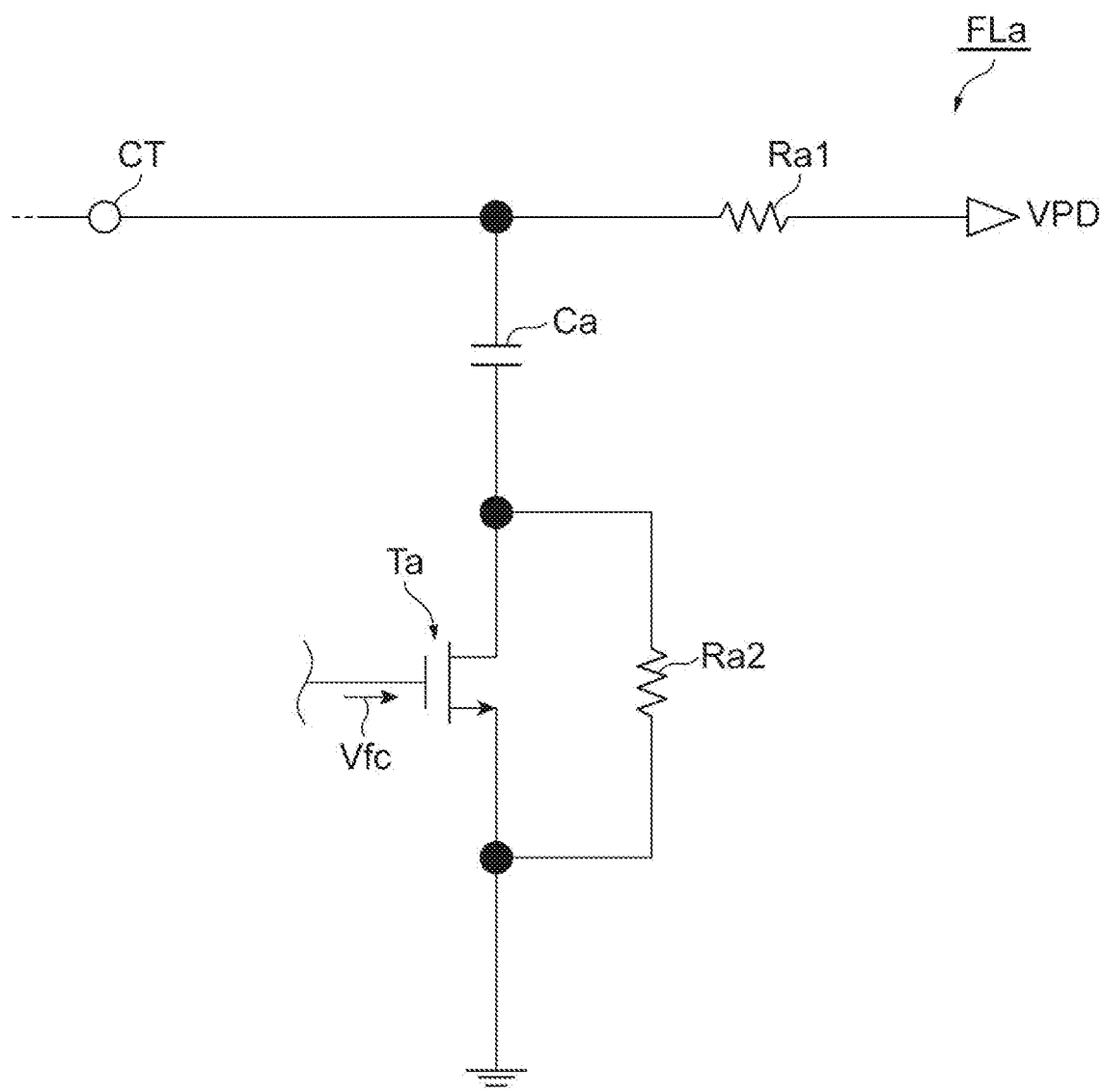
FIG. 3 is a diagram showing an example of a main configuration of the filter circuit shown in FIG. 1.
Figure 4:
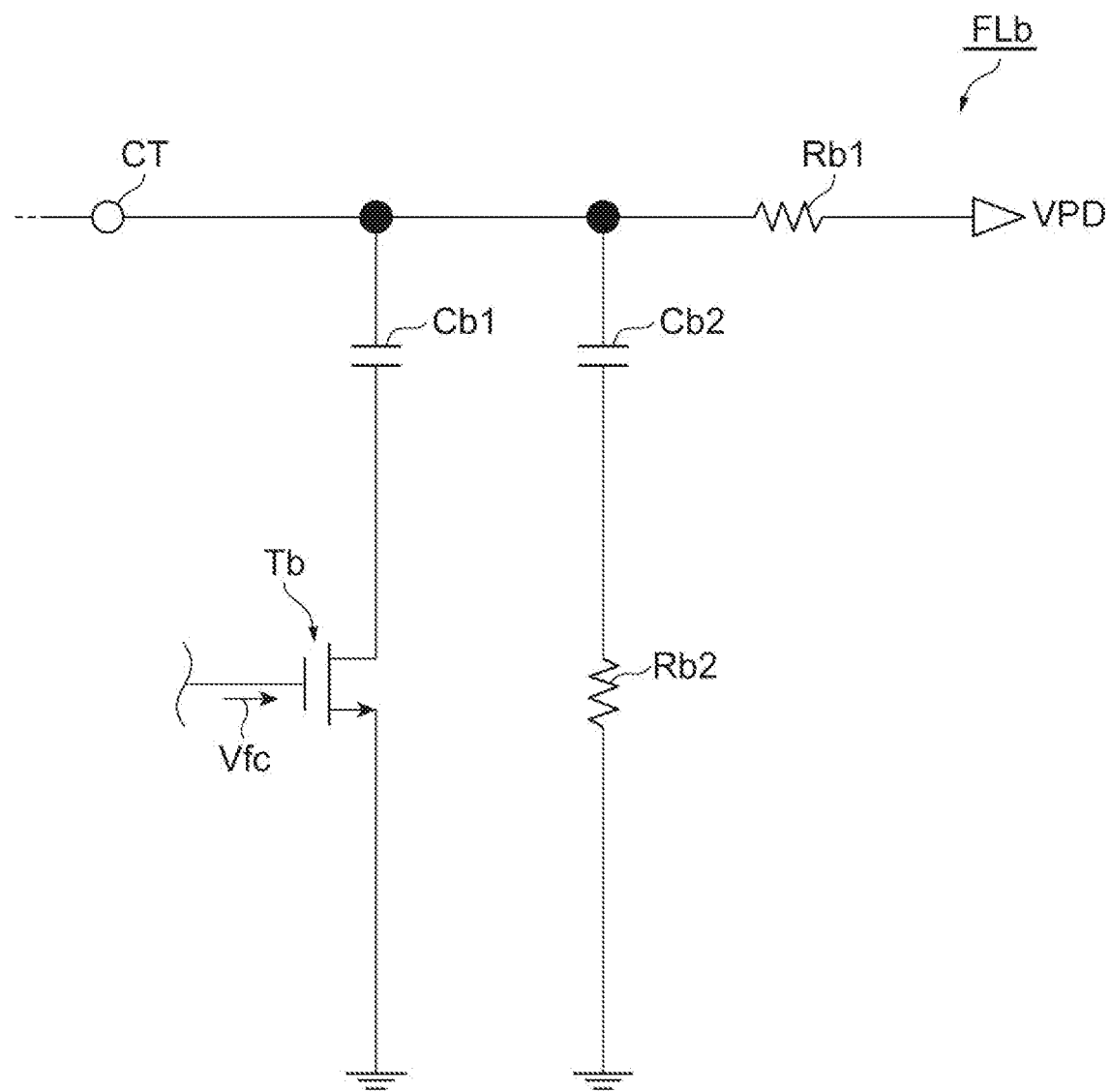
FIG. 4 is a diagram showing an example of a main configuration of the filter circuit shown in FIG. 1.
Figure 5:
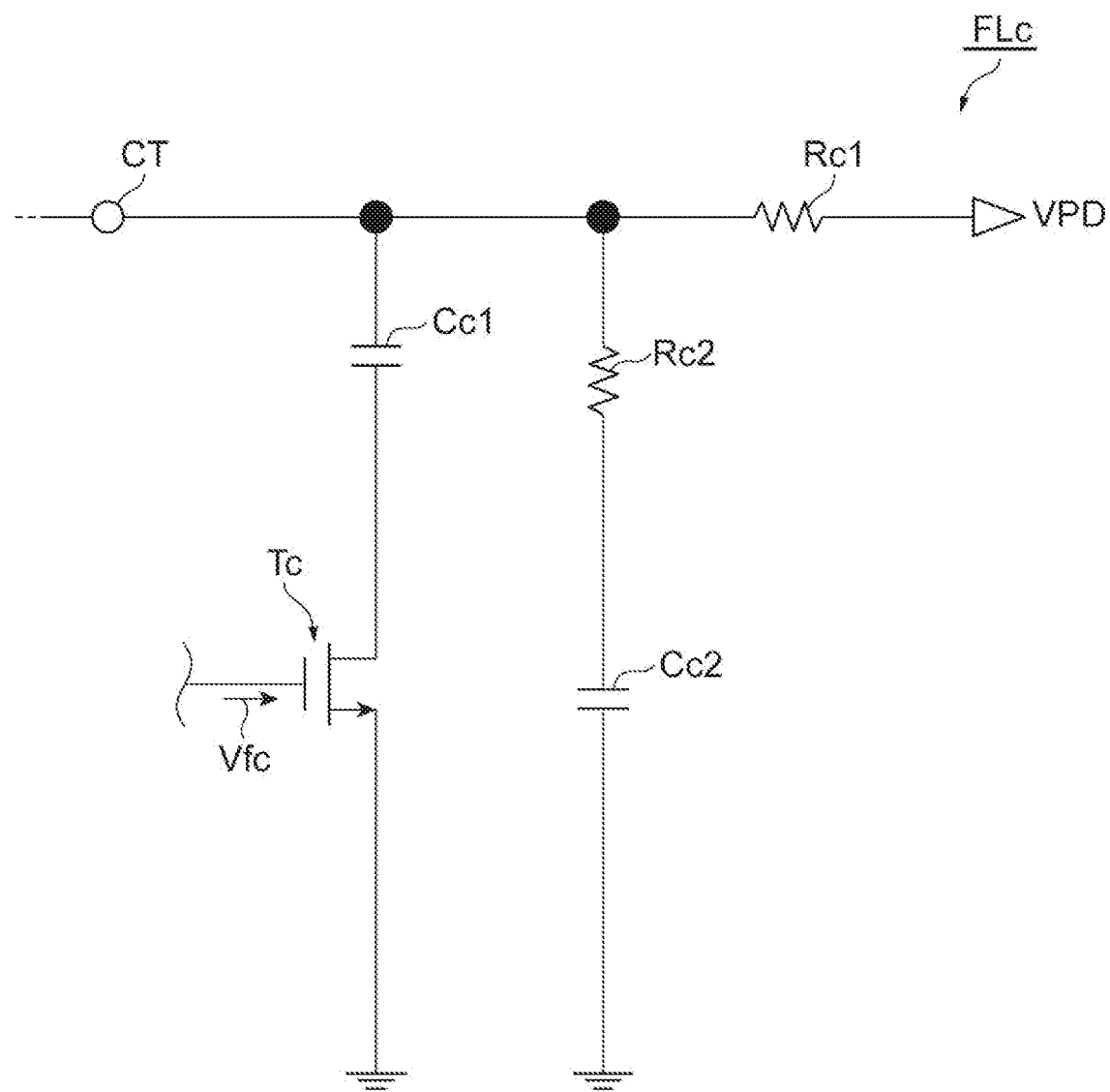
FIG. 5 is a diagram showing an example of a main configuration of the filter circuit shown in FIG. 1.

The filter circuit FL shown in FIG. 1 can be, for example, one of the filter circuit FLa shown in FIG. 3, the filter circuit FLb shown in FIG. 4, and the filter circuit FLc shown in FIG. 5. First, with reference to FIG. 3, an example of the filter circuit FL shown in FIG. 1 is described. The filter circuit FLa shown in FIG. 3 is an example of the filter circuit FL shown in FIG. 1.

The filter circuit FLa includes a field effect transistor (FET) Ta, a resistor Ra1 (second resistor) and a resistor Ra2 (third resistor), and a capacitor Ca. One end of the resistor Ra1 is electrically connected to the bias terminal CT. The other end of the resistor Ra1 is electrically connected to the power supply VPD. The power supply VPD is, for example, a DC power supply circuit for supplying the bias voltage to the photodiode PD.

The on-resistance between the drain and the source of the FET Ta is set to a resistance value smaller than a resistance value of the resistor Ra2. Therefore, the impedance between the capacitor Ca and ground can be reduced by turning on the FET Ta. The impedance between the capacitor Ca and ground corresponds to a combined resistance of the on-resistance of the FET Ta and the resistance of the resistor Ra2.

The FET Ta can be, for example, an N-type MOSFET.

The capacitor Ca is electrically connected between the drain of the FET Ta and one end of the resistor element Ra1.

The capacitor Ca may be electrically connected between the drain of the FET Ta and the bias terminal CT. The source of the FET Ta is grounded, for example. The gate of the FET Ta receives the filter control voltage Vfc output from the control circuit AGC.

The resistor Ra2 is electrically connected between the source and the drain of the FET Ta. An input impedance (second input impedance) of the filter circuit FLa viewed from the bias terminal CT includes resistance (damping resistance) of a parallel circuit constituted by the resistor Ra2 and the on-resistance between the source and the drain of the FET Ta.

The FET Ta becomes an on-state, when the filter control voltage Vfc becomes larger than the threshold voltage of the FET Ta. In the on-state, the resistance (on-resistance) between the source and drain of the FET Ta is reduced to a value equal to or less than a resistance value of the resistor Ra2, so that a damping resistance becomes less than the resistance value of the resistor Ra2. In this case, the damping function of the filter circuit FLa is deactivated, and the input impedance of the filter circuit FLa viewed from the bias terminal CT becomes relatively small, because the damping resistance is decreased. The damping function of the filter circuit Fla is deactivated by the filter control voltage Vfc output from the control circuit AGC, when the bypass circuit and the bypassing function thereof are deactivated by the gain control voltage Vacn output from the control circuit AGC.

The FET Ta becomes an off-state, when the filter control voltage Vfc becomes lower than the threshold voltage of the FET Ta. In the off-state, the resistance value between the source and drain of the FET Ta is increased several tens of times or more than the resistance value of the resistor Ra2, and the damping resistance becomes substantially equal to the resistance value of the resistance element Ra2. In this case, the damping function of the filter circuit Fla is activated, and the input impedance of the filter circuit FLa viewed from the bias terminal CT becomes relatively large, because the damping resistance is increased. The damping function of the filter circuit Fla is activated by the filter control voltage Vfc output from the control circuit AGC, when the bypass circuit ACN and the bypassing function thereof are activated by the gain control voltage Vacn output from the control circuit AGC.

Therefore, when the bypass circuit ACN and the bypassing function thereof are deactivated, the input impedance (second input impedance) of the filter circuit FLa viewed from the bias terminal CT is decreased, and when the bypass circuit ACN and the bypassing function thereof are activated, the input impedance (second input impedance) of the filter circuit FLa viewed from the bias terminal CT is increased. Increasing of the input impedance of the filter circuit FLa can suppress the resonance phenomena due to the parasitic inductances and the parasitic capacitances. That is, when the damping resistance is increased, the effect suppressing the resonance phenomenon is enhanced, and when the damping resistance is decreased, the effect suppressing the resonance phenomenon is weakened.

When the bypass circuit ACN and the bypassing function thereof are activated, relative decrease in the input impedance of the input terminal IN of the TIA circuit AP may cause the resonance phenomenon. However, when the damping function of the filter circuit FLa is activated and the damping resistance of the filter circuit Fla is increased, relative increase in the input impedance of the bias terminal CT can suppress the resonance phenomenon by offsetting the relative decrease in the input impedance of the input terminal IN. On the other hand, when the bypass circuit ACN and the bypassing function thereof are deactivated, relative increase in the input impedance of the input terminal IN can suppress the resonance phenomenon. Meanwhile, when the damping function of the filter circuit Fla is deactivated and the damping resistance of the filter circuit Fla is decreased, relative decrease in the input impedance of the bias terminal CT does not obstruct the suppression of the resonance phenomenon by the relative increase in the input impedance of the input terminal IN. Thus, such interlocking of the bypass circuit and the damping circuit as described above allows the resonance phenomenon to be suppressed all the time.

Referring to FIG. 4, another example of the filter circuit FL shown in FIG. 1 is described. The Filter circuit FLb shown in FIG. 4 is an example of the filter circuit FL shown in FIG. 1.

The filter circuit FLb includes a FET Tb, a resistor Rb1 (second resistor), and a resistor Rb2 (third resistor). The filter circuit FLb further includes a capacitor Cb1 (first capacitor) and a capacitor Cb2 (second capacitor). The FET Tb can be, for example, an N-type MOSFET.

One end of the resistor Rb1 is electrically connected to the bias terminal CT. The other end of the resistive element Rb1 is electrically connected to the power supply VPD. The power supply VPD is, for example, a DC power supply circuit for supplying the bias voltage to the photodiode PD.

The capacitor Cb1 is electrically connected between the one end of the resistor Rb1 and the drain of the FET Tb. The capacitor Cb1 may be electrically connected between the bias terminal CT and the drain of the FET Tb. The source of the FET Tb is grounded, for example. The gate of the FET Tb receives the filter control voltage Vfc output from the control circuit AGC.

The capacitor Cb2 is electrically connected between the resistor Rb2 and the one end of the resistor element Rb1 and the capacitor Cb2 may be electrically connected between the bias terminal CT and the drain of the FET Tb. The capacitor Cb2 is grounded through a resistor Rb2.

When the filter control voltage Vfc becomes larger than the threshold voltage of the FET Tb, the FET Tb becomes an on-state. In the on-state, the resistance value between the drain and source of the FET Tb is reduced to a value equal to or less than the resistance value of the resistor Rb2, so that a resistance component (damping resistance) of the input impedance (second input impedance) of the filter circuit FLb viewed from the bias terminal CT becomes smaller than the resistance value of the resistor Rb2. In this case, the damping function of the filter circuit FLb is deactivated, and the input impedance (second input resistance) of the filter circuit FLb viewed from the bias terminal CT becomes relatively small. The damping function of the filter circuit FLb is deactivated by the filter control voltage Vfc, when the bypass circuit and the bypassing function thereof ACN are deactivated by the gain control voltage Vacn.

When the filter control voltage Vfc becomes lower than the threshold voltage of the FET Tb, the FET Tb becomes an off-state. In the off-state, the resistance value between the drain and source of the FET Tb is increased several tens of times or more larger than the resistance value of the resistor Rb2, so that the resistance component (damping resistance) of the input impedance (second input impedance) of the filter circuit FLb viewed from the bias terminal CT becomes substantially equal to the resistance value of the resistor Rb2. In this case, the damping function of the filter circuit FLb is activated, and the input impedance of the filter circuit FLb viewed from the bias terminal CT becomes relatively large. The damping function of the filter circuit FLb is activated by the filter control voltage Vfc, when the bypass circuit ACN and the bypassing function thereof are activated by the gain control voltage Vacn.

Therefore, when the damping function is deactivated, the resistance component (damping resistance) included in the input impedance (second input impedance) of the filter circuit FLb is reduced, and when the damping function is activated, the resistance component (damping resistance) included in the input impedance (second input impedance) of the filter circuit FLb is increased. The damping resistance has an effect suppressing the resonance phenomena due to the parasitic inductances and the parasitic capacitances. That is, when the damping resistance is increased, the effect suppressing the resonance phenomenon is enhanced, and when the damping resistance is decreased, the effect suppressing the resonance phenomenon is weakened.

When the bypass circuit ACN and the bypassing function thereof are activated, relative decrease in the input impedance of the input terminal IN of the TIA circuit AP may cause the resonance phenomenon. However, when the damping function of the filter circuit FLb is activated and the damping resistance of the filter circuit Flc is increased, relative increase in the input impedance of the bias terminal CT can suppress the resonance phenomenon by offsetting the relative decrease in the input impedance of the input terminal IN. On the other hand, when the bypass circuit ACN and the bypassing function thereof are deactivated, relative increase in the input impedance of the input terminal IN can suppress the resonance phenomenon. When the damping function of the filter circuit FLb is deactivated and the damping resistance of the filter circuit Flc is decreased, relative decrease in the input impedance of the bias terminal CT does not obstruct the suppression of the resonance phenomenon by the relative increase in the input impedance of the input terminal IN. Thus, such interlocking of the bypassing function and the first function as described above allows the resonance phenomenon to be always suppressed.

Referring to FIG. 5, another example of the filter circuit FL shown in FIG. 1 is described. The filter circuit FLc shown in FIG. 5 is an example of a filter circuit FL shown in FIG. 1.

The filter circuit FLc includes a FET Tc, and a resistor Rc1 (second resistor), and the resistor Rc2 (third resistor). The filter circuit FLc further includes a capacitor Cc1 (first capacitor) and a capacitor Cc2 (second capacitor).

One end of the resistor Rc1 is electrically connected to the bias terminal CT. The other end of the resistor Rc1 is electrically connected to the power supply VPD. The power supply VPD is, for example, a DC power supply circuit for supplying the bias voltage to the photodiode PD.

The capacitor Cc1 is electrically connected between the one end of the resistor Rc1 and the drain of the FET Tc. The capacitor Cc1 may be electrically connected between the bias terminal CT and the drain of the FET Tc.

The source of the FET Tc is grounded. The gate of the FET Tc receives the filter control voltage Vfc output from the control circuit AGC.

The resistor Rc2 is electrically connected between the one end of the resistor Rc1, which is electrically connected to the bias terminal CT, and the capacitor Cc2. The resistor Rc2 is grounded through the capacitor Cc2.

When the filter control voltage Vfc becomes larger than the threshold voltage of the FET Tc, the FET Tc becomes an on-state. In the on-state, the resistance value between the drain and source of the FET Tc is reduced to a value equal to or less than the resistance value of the resistor Rc2, so that the resistance component (damping resistance) of the input impedance (second input impedance) of the filter circuit FLc viewed from the bias terminal CT becomes smaller than the resistance value of the resistor Rc2. In this case, the damping function of the filter circuit FLc is deactivated, and the input impedance of the filter circuit FLc viewed from the bias terminal CT becomes relatively small. The damping function of the filter circuit FLc is deactivated by the filter control voltage Vfc, when the bypass circuit ACN and the bypassing function of the bypass circuit ACN are deactivated by the gain control voltage Vacn.

When the filter control voltage Vfc becomes lower than the threshold voltage of the FET Tc, the FET Tc becomes an off-state. In the off-state, the resistance value between the drain and source of the FET Tc is increased several tens of times or more larger than the resistance value of the resistor Rc2, so that the resistance component (damping resistance) of the input impedance (second input impedance) of the filter circuit FLc viewed from the bias terminal CT becomes substantially equal to the resistance value of the resistor Rc2. In this case, the damping function of the filter circuit FLc is activated, and the input impedance (second input impedance) of the filter circuit FLc viewed from the bias terminal CT becomes relatively large. The damping function of the filter circuit FLc is activated by the filter control voltage Vfc, when the bypass circuit ACN and the bypassing function thereof are activated by the gain control voltage Vacn.

Therefore, when the damping function is deactivated, the resistance component (damping resistance) included in the input impedance (second input impedance) of the filter circuit FLc is reduced, and when the dumping function is activated, the resistance component (damping resistor) included in the input impedance (second input impedance) of the filter circuit FLc is increased. The damping resistance has an effect suppressing the resonance phenomena due to the parasitic inductances and the parasitic capacitances. That is, when the damping resistance is increased, the effect suppressing the resonance phenomenon is enhanced, and when the damping resistance is decreased, the effect suppressing the resonance phenomenon is weakened.

When the bypass circuit ACN and the bypassing function thereof are activated, relative decrease in the input impedance of the input terminal IN of the TIA circuit AP may cause the resonance phenomenon. However, when the damping function of the filter circuit FLc is activated and the damping resistance of the filter circuit Flc is increased, relative increase in the input impedance of the bias terminal CT can suppress the resonance phenomenon by offsetting the relative decrease in the input impedance of the input terminal IN. On the other hand, when the bypass circuit ACN and the bypassing function thereof are deactivated, relative increase in the input impedance of the input terminal IN of the TIA circuit AP can suppress the resonance phenomenon. When the damping function of the filter circuit FLc is deactivated and the damping resistance of the filter circuit Flc is decreased, relative decrease in the input impedance of the bias terminal CT does not obstruct the suppression of the resonance phenomenon by the relatively increase in the input impedance of the input terminal IN. Thus, such interlocking of the bypass circuit and the damping circuit as described above allows the resonance phenomenon to be suppressed all the time.

Figure 6:
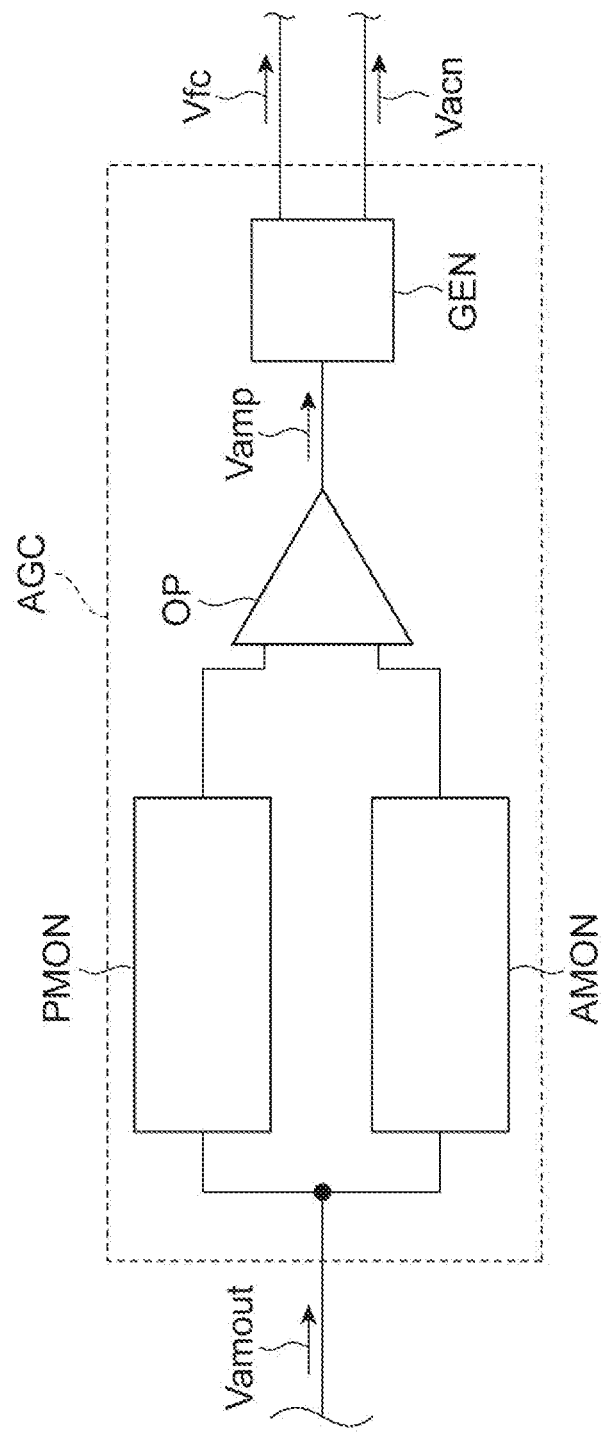
FIG. 6 is a diagram showing an example of a configuration included in the control circuit shown in FIG. 1.
Figure 7:
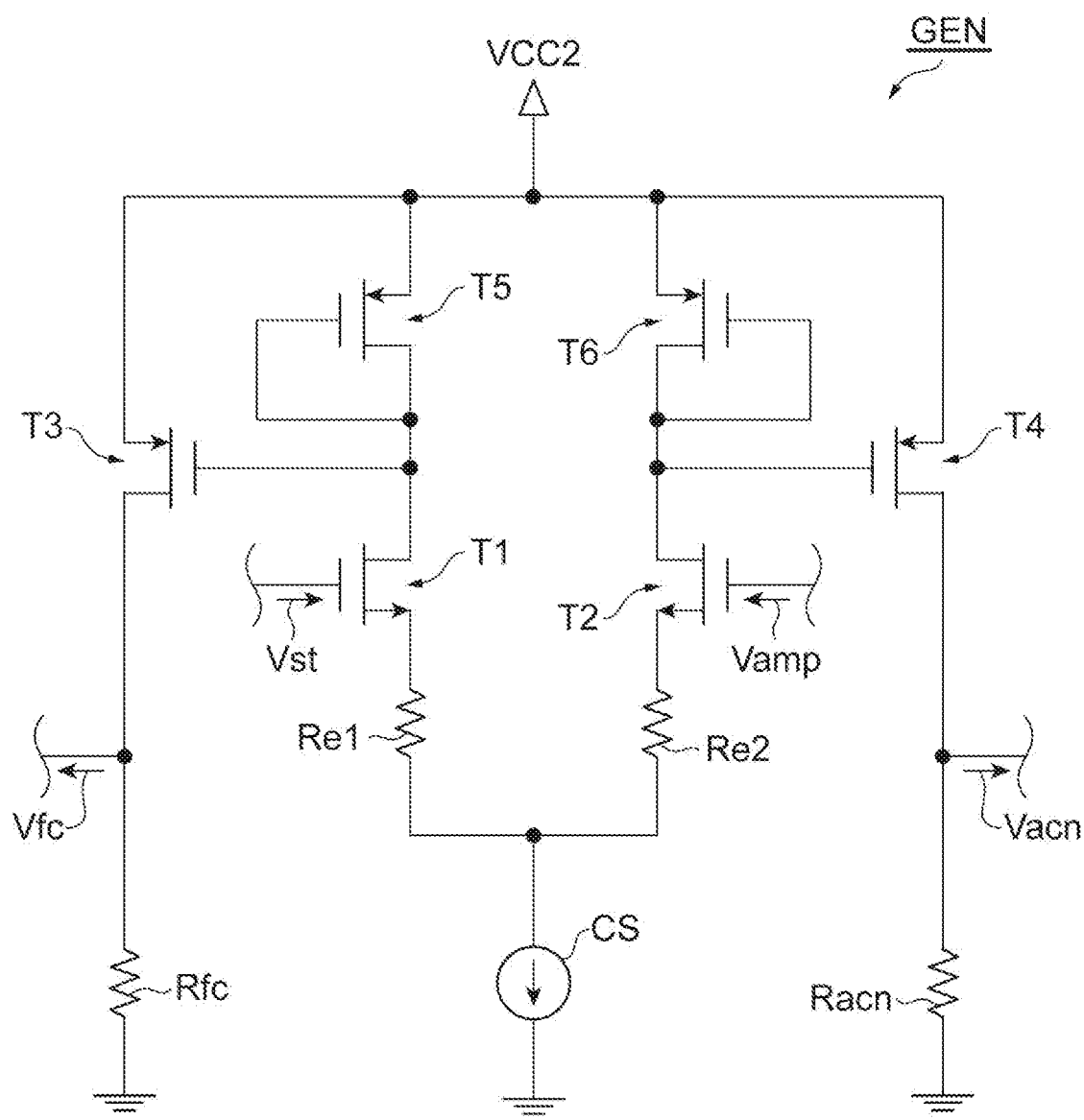
FIG. 7 is a diagram showing an example of a configuration included in the control circuit shown in FIG. 1.

An example of the configuration of the control circuit AGC is described with reference to FIGS. 6 and 7. The control circuit AGC may include, for example, a peak detection circuit PMON, an average value detection circuit ANION, an operational amplifier OP, and a voltage generating circuit GEN, as shown in FIG. 6.

The peak detection circuit PMON and the average value detection circuit AMON are electrically connected to the output of the amplifier circuit AM. The voltage generating circuit GEN is electrically connected to the bypass circuit ACN and the filter circuit FL. The output voltage Vamout input to the control circuit AGC is input to the peak detection circuit PMON and the average value detection circuit AMON. Each of the peak detection circuit PMON and the average value detection circuit AMON has input impedance set to a value sufficiently larger than the output impedance of the amplifier circuit AM. A signal output from the peak detector PMON and a signal output from the average value detection circuit AMON are input to a differential input of the operational amplifier OP, and a difference in voltage (differential voltage) between the two signals is amplified by the operational amplifier OP. The operational amplifier OP outputs the amplified deferential voltage as an amplitude-dependent potential Vamp.

The amplitude-dependent potential Vamp is input to the voltage generating circuit GEN. The voltage generating circuit GEN generates the filter control voltage Vfc and the gain control voltage Vacn in accordance with the amplitude-dependent potential Vamp.

The peak detection circuit PMON detects a peak value of the output voltage Vamout. The peak detection circuit PMON outputs a signal indicating the detected peak value to a differential input of the operational amplifier OP.

The average value detection circuit AMON detects an average value of the output voltage Vamout. The average value means an average value for time, for example, and corresponds to a DC component of the output voltage Vamout. The average value detection circuit ANION outputs a signal indicating the detected average value to the differential input of the operational amplifier OP. The differential input includes a pair of inputs, for example, a non-inverting input and an inverting input. For example, the output of the peak detection circuit PMON is input to one of the paired inputs, and the output of the average value detection circuit ANION is input to the other of the paired inputs.

The operational amplifier OP outputs an amplitude-dependent potential Vamp indicating magnitude of the output voltage Vamout to the voltage generating circuit GEN, based at least in part on the signal indicating a peak value output from the peak detection circuit PMON and the signal indicating an average value output from the average value detection circuit ANION.

The amplitude-dependent potential Vamp has a potential depending on the amplitude of the output voltage Vamout output from the amplifier circuit AM.

The voltage generating circuit GEN outputs the filter control voltage Vfc to the filter circuit FL, and outputs the gain control voltage Vacn to the bypass circuit ACN in accordance with the amplitude-dependent potential Vamp. The filter control voltage Vfc output from the voltage generating circuit GEN, as shown in FIG. 7, is output from the drain of a FET T3 of the voltage generating circuit GEN. A low pass filter may be inserted between the voltage generating circuit GEN and the filter circuit FL to stabilize the filter control voltage Vfc. The gain control voltage Vacn output from the voltage generating circuit GEN, as shown in FIG. 7, is output from the drain of a FET T4 of the voltage generating circuit GEN. A low pass filter may be inserted between the voltage generating circuit GEN and the bypass circuit ACN to stabilize the gain control voltage Vacn. The FET T3 and the FET T4 are described below.

The voltage generating circuit GEN includes a FET T1 (first FET) and a FET T2 (second FET). The voltage generating circuit GEN further includes the FET T3 (third FET) and the FET T4 (fourth FET). The voltage generating circuit GEN further includes a FET T5 (fifth field effect transistor) and a FET T6 (sixth FET).

The voltage generating circuit GEN further includes a resistor Re1 (fourth resistor) and a resistor Re2 (fifth resistor). The voltage generating circuit GEN further includes a resistor Rfc (sixth resistor) and a resistor Racn (seventh resistor). The voltage generating circuit GEN further includes a current source CS.

The FET T1 and the FET T2 may be, for example, N-type MOS FETs. The FET T3, the FET T4, the FET T5, and the FET T6 can be, for example, P-type MOSFETs.

The gate of the FET T1 receives a static potential Vst supplied from the outside. The static potential Vst may be generated in the voltage generating circuit GEN. The gate of the FET T2 receives the amplitude-dependent potential Vamp depending on amplitude of the output voltage Vamout.

The source of the FET T1 is electrically connected to the current source CS through the resistor Re1. The source of the FET T2 is electrically connected to the current source CS through the resistor Re2.

The drain of the FET T3 is grounded through the resistor Rfc. The source of the FET T3 is electrically connected to the power supply VCC2. The power supply VCC2 supplies a power supply voltage Vcc2 to the voltage generation circuit GEN. The FET T3 and the resistor Rfc constitute an inverting circuit. The gate of the FET T3 in an input of the inverting circuit, and the drain of the FET T3 is an output of the inverting circuit. The drain of the FET T3 outputs the filter control voltage Vfc to the filter circuit FL. The power supply voltage Vcc2 is a reference potential for the input of the inverting circuit. For example, when drain potential of the FET T1 becomes smaller than the threshold voltage of the FET T3 with respect to the reference potential, the FET T3 is turned on and the drain current of the FET T3 flows through the resistor Rfc. Increasing of the voltage drop of the resistor Rfc increases the filter control voltage Vfc with reference to the ground potential. When the drain voltage of the FET T1 becomes larger than the threshold voltage of the FET T3, The FET T1 is turned off and the drain current of the FET T3 is shut off. The filter control voltage Vfc becomes a value close to 0V with reference to the ground potential.

The drain of the FET T4 is grounded through the resistor Racn. The source of the FET T4 is electrically connected to the power supply VCC2. The FET T4 and the resistor Racn constitute another inverting circuit. The gate of the FET T4 in an input of another inverting circuit, and the drain of the FET T4 is an output of another inverting circuit. The drain of the FET T4 outputs the filter control voltage Vfc to the filter circuit FL. The drain of the field effect transistor T4 outputs the gain control voltage Vacn to the bypass circuit ACN. The power supply voltage Vcc2 is a reference potential for the input of another inverting circuit. For example, when drain potential of the FET T2 becomes smaller than the threshold voltage of the FET T4 with respect to the reference potential, the FET T4 is turned on and the drain current of the FET T4 flows through the resistor Racn. Increasing of the voltage drop of the resistor Racn increases the gain control voltage Vacn with reference to the ground potential. When the drain voltage of the FET T2 becomes larger than the threshold voltage of the FET T4, the FET T4 is turned off and the drain current of the FET T4 is shut off.

The gain control voltage Vacn becomes a value close to 0V with reference to the ground potential.

A voltage value of the gain control voltage Vacn may be referred to as Vg1 [V] and a voltage value of the filter control voltage Vfc may be referred to as Vg2 [V]. For example, Vg1 [V] and Vg2 [V] may satisfy an equation Vg1=2.2−Vg2 [V]. For example, Vg1=1.2 [V] and Vg2=1.0 [V] are possible, when the amplitude-dependent potential Vamp is lower than the static potential Vst, or Vg1=2.0 [V] and Vg2=0.2 [V] are possible, when the amplitude-dependent potential Vamp is higher than the static potential. For example, when the bypass circuit ACN is constituted by an n-type MOSFET, by setting the threshold voltage of the n-type MOSFEWTs to an appropriate value, the setting of Vg1=2.0 [V] and Vg2=0.2 [V] allows the bypass circuit ACN to be activated and subtract the bypass current Iacn from the AC component of the current signal Ipd. In addition, the setting of Vg1=1.2 [V] and Vg2=1.0 [V] allows the bypassing function of the bypass circuit ACN to be deactivated, so that the bypass current Iacn hardly flows into the bypass circuit and the input current Iin input to the amplifier circuit AM has amplitude substantially equal to amplitude of the current signal Ipd.

The drain of the FET T1, the drain of the FET T5, and the gate of the FET T3 are electrically connected to each other. The drain of the FET T2, the drain of the FET T6, and the gate of the FET T4 are electrically connected to each other. The respective sources of the FET T3, the FET T4, the FET T5, and the FET T6 are electrically connected to the power supply VCC2, or a power line electrically connected to the power supply VCC2. The power supply VCC2 supplies a power supply voltage Vcc2 to the FET T3, the FET T4, the FET T5, and the FET T6.

Incidentally, each of the resistor Rfc and the resistor Racn may be replaced with a diode. In this case, the gain control voltage Vacn and the filter control voltage Vfc relatively easily obtain offset voltages thereof.

Figure 8:
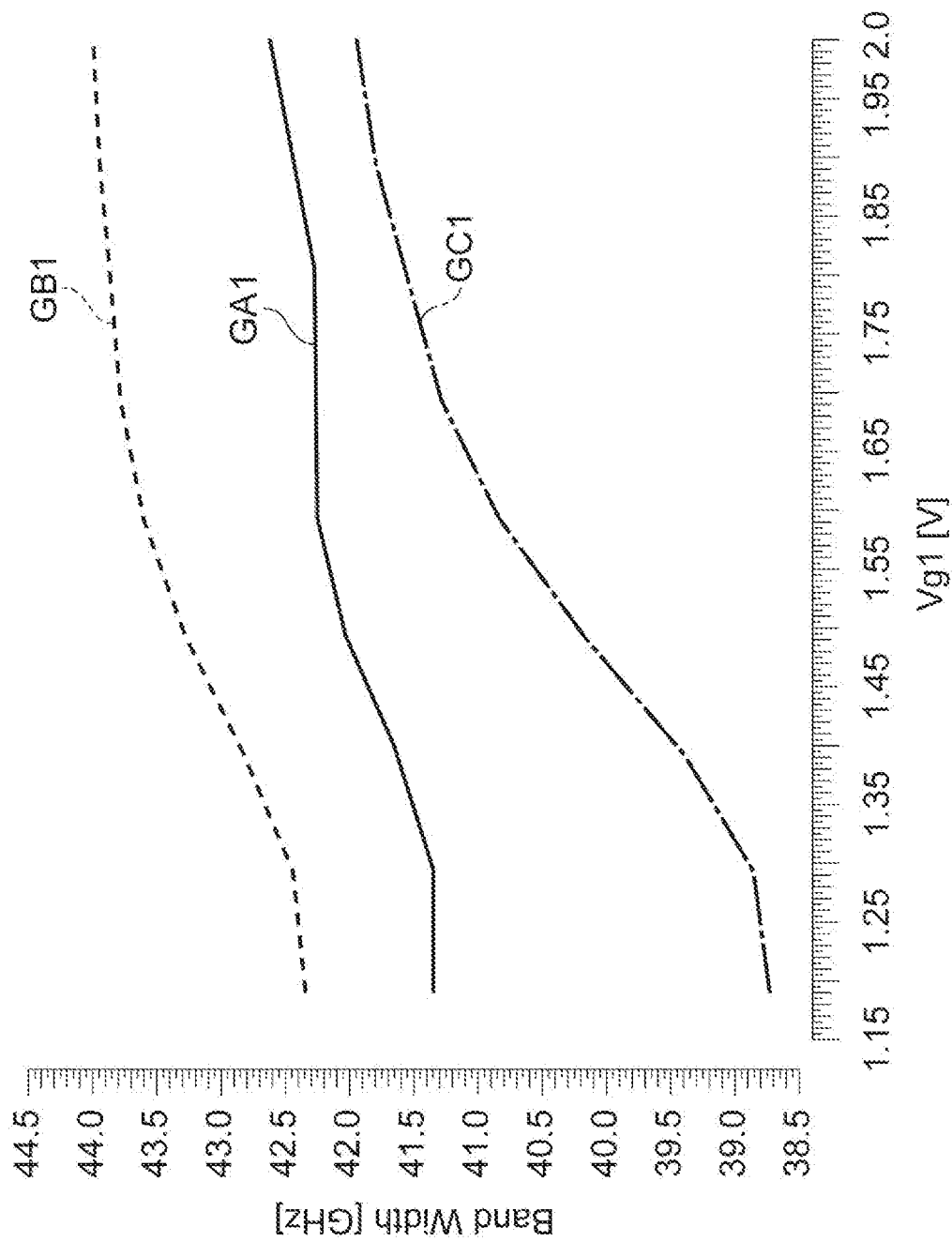
FIG. 8 is a diagram for explaining an effect of the optical receiver shown in FIG. 1.
Figure 9:
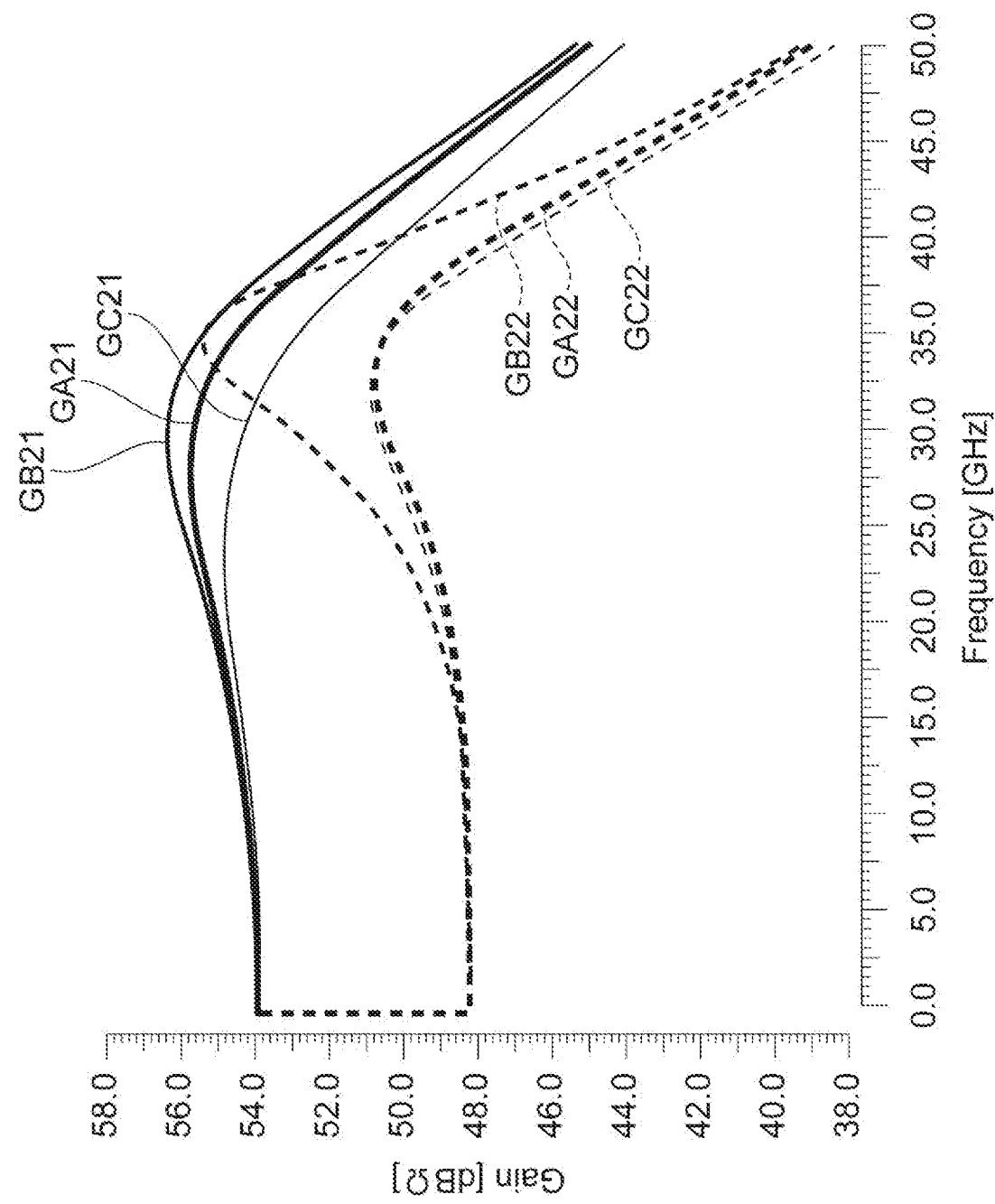
FIG. 9 is a diagram for explaining an effect of the optical receiver shown in FIG. 1.
Figure 10:
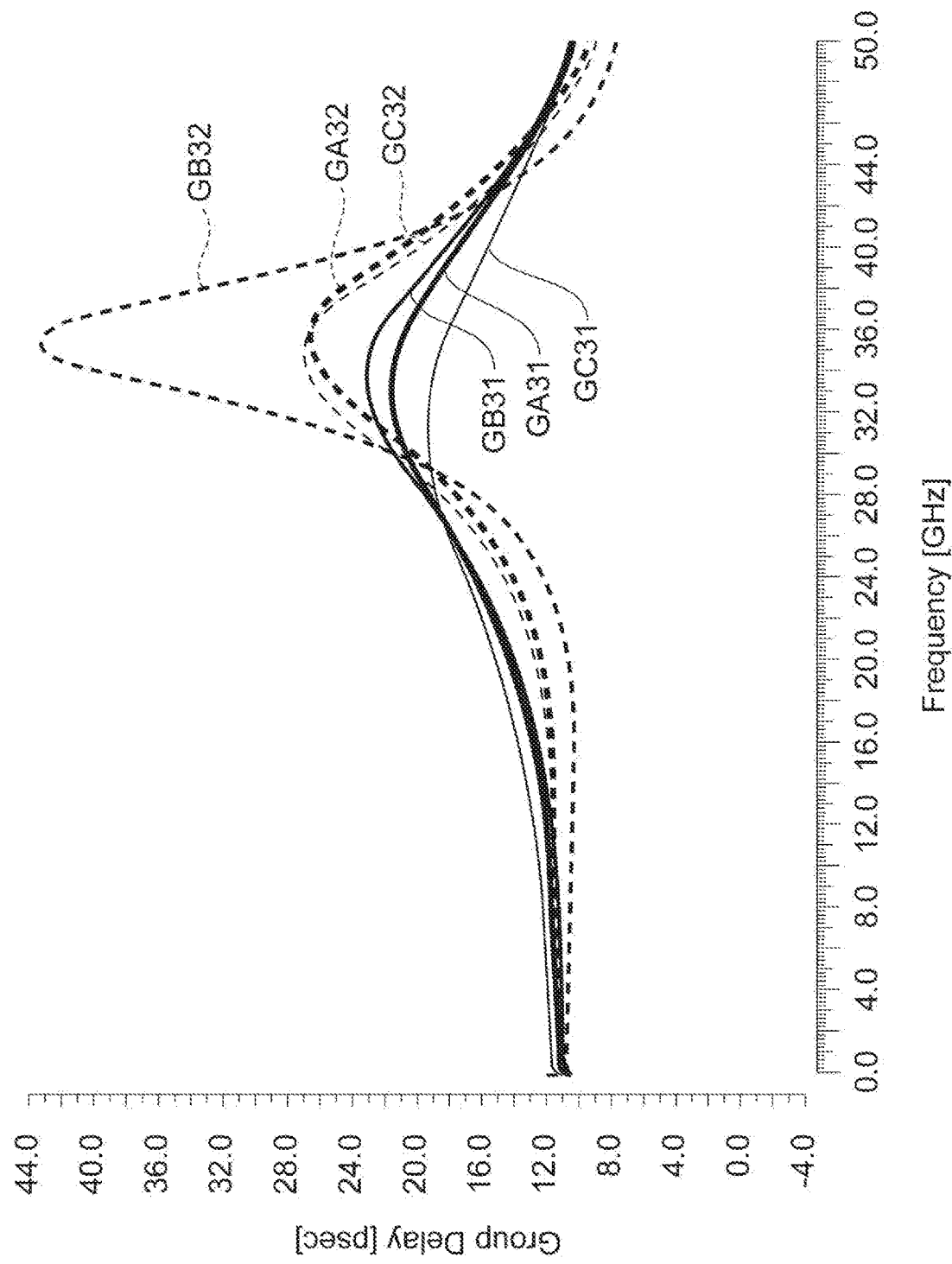
FIG. 10 is a diagram for explaining an effect of the optical receiver shown in FIG. 1.

Referring to FIGS. 8, 9, and 10, operation of the optical receiver 1 is described. Bandwidth characteristic are shown in FIG. 8. Gain (transimpedance gain) characteristics are shown in FIG. 9. Group delay characteristics are shown in FIG. 10.

In FIG. 8, the horizontal axis represents voltage value Vg1 [V] of the gain control voltage Vacn, and the vertical axis represents the bandwidth of the optical receiver 1. In FIG. 9, the horizontal axis represents the frequency [GHz] of the photocurrent input from the photodiode PD to the amplifier circuit AM, and the vertical axis represents the gain [dBΩ] of the TIA circuit AP. In FIG. 10, the horizontal axis represents the frequency [GHz] of the photocurrent input from the photodiode PD to the amplifier circuit AM, the vertical axis represents the group delay [psec] of the signal output from the TIA circuit AP.

The curve GA1 shown in FIG. 8, the curves GA21 and GA22 shown in FIG. 9, and the curves GA31 and GA32 shown in FIG. 10, are results when the filter circuit FLa shown in FIG. 3 is used. In particular, the curve GA21 and the curve GA31 shows the results for the setting of Vg1=1.2 [V] and Vg2=1.0 [V] (when the bypass current Iacn hardly flows into the bypass circuit ACN). The curve GA22 and the curve GA32 are the results for the setting of Vg1=2.0 [V] and Vg2=0.2 [V] (when the bypass current Iacn flows into the bypass circuit ACN).

The curve GB1 shown in FIG. 8, the curves GB21 and GB22 shown in FIG. 9, the curves GB31 and GB32 shown in FIG. 10 are results for a comparative example 1. In the comparative example 1, the FET Ta and the resistor Ra2 are removed from the configuration shown in FIG. 3, and accordingly the capacitor Ca is directly grounded. In particular, the curve GB21 and the curve GB31 shows the results for the setting of Vg1=1.2 [V] and Vg2=1.0 [V] (when the bypass current Iacn hardly flows the bypass circuit ACN). The curve GB22 and the curve GB32 shows the results for the setting of Vg1=2.0 [V] and Vg2=0.2 [V] (when the bypass current Iacn flows into the bypass circuit ACN).

The curve GC1 shown in FIG. 8, the curves GC21 and GC22 shown in FIG. 9, the curves GC31 and GC32 shown in FIG. 10 are results for a comparative example 2. In the comparative example 2, the FET Ta is removed from the configuration shown in FIG. 3. In particular, the curve GC21 and the curve GC31 shows the results for the setting of Vg1=1.2 [V] and Vg2=1.0 [V] (when the bypass current Iacn hardly flows into the bypass circuit ACN). The curve GC22 and the curve GC32 shows the results for the setting of Vg1=2.0 [V] and Vg2=0.2 [V] (when the bypass current Iacn flows into the bypass circuitry ACNs).

According to the result shown in FIG. 8, the curve GC1 (when the FET Ta is removed from the configuration shown in FIG. 3 in the filter circuit) has a smaller bandwidth and a larger dependence on Vg1 than the curve GA1 and the curve GB1. The bandwidth characteristics of the curve GA1 and the curve GB1 are better than the bandwidth characteristic of the curve GC1. However, according to the results shown in FIGS. 9 and 10, the curve GB22 has a large resonance peak in the gain characteristics, and further the curve GB32 has a large resonance peak in the group delay characteristics. Such resonant peaks in the gain characteristics and the group delay characteristics are undesirable because they may lead to degradation of signal quality of an optical receiver. The curve GB22 and the curve GB32 are the results for the comparable example 1 when the bypass current Iacn flows into the bypass circuit ACN. The comparable example 1 does not have the damping function, because the capacitor Ca is directly grounded by removing the FET Ta and resistor Ra2 from the configuration shown in FIG. 3 and the input impedance of the filter circuit is invariable by the filter control voltage Vfc.

On the other hand, in the curves GA21, GA22, GA31, and GA32 (obtained when the filter circuit FLa having the configuration shown in FIG. 3 is used), large resonant peaks are suppressed in the gain characteristics and the group delay characteristics regardless of whether the bypass circuit is activated or deactivated. The curve GA1 has a larger bandwidth and a smaller dependence on Vg1 than the curve GC1. The optical receiver with the filter circuit FLa (filter circuit FL) shown in FIG. 3 according to embodiments of the present disclosure is superior in the bandwidth characteristics, the gain characteristics, and the group delay characteristics. Such advantages have been confirmed also for the filter circuit FLb shown in FIG. 4 and the filter circuit FLc shown in FIG. 5.

In the TIA circuit AP, the current signal Ipd input to the input terminal IN can be reduced by the bypass circuit ACN to maintain linearity between the input and the output of the TIA circuit AP. The bypass circuit may reduce the input impedance of the TIA circuit AP and cause the resonance phenomenon due to parasitic inductances and parasitic capacitances around the photodiode PD. However, in the optical receiver 1 according to embodiments of the present disclosure, when the bypass circuit ACN and the bypassing function thereof are activated, the resonance phenomenon due to the parasitic inductance and the parasitic capacitance can be suppressed by the damping function of the filter circuit FL. Therefore, the degradation of the bandwidth, gain, and group delay caused by the resonance phenomenon due to the parasitic inductance and the parasitic capacitance can be prevented.

While various exemplary embodiments have been described above, various omissions, substitutions, and changes may be made without being limited to the exemplary embodiments described above. It is also possible to combine elements in different embodiments to form other embodiments.

From the foregoing description, it will be appreciated that various embodiments of the present disclosure have been described herein for purposes of description and that various changes may be made without departing from the scope and spirit of the disclosure. Accordingly, the various embodiments disclosed herein are not intended to be limiting, with a true scope and spirit being indicated by the appended claims.

What is claimed is:

1. An optical receiver comprising:
    a bias terminal;
    an input terminal;
    a photodiode having an anode and a cathode, the anode being electrically connected to the input terminal, the cathode being electrically connected to the bias terminal, the photodiode being configured to convert an optical signal to a current signal;
    an amplifier circuit having an input and an output, the amplifier circuit being configured to receive an input current through the input, to convert the input current to an output voltage, and to output the output voltage from the output;
    a first resistor electrically connected between the input and output of the amplifier circuit;
    a bypass circuit electrically connected to the input terminal, the bypass circuit being configured to decrease a first input impedance of the bypass circuit viewed from the input terminal, when the bypass circuit is activated by a first control signal, and configured to increase the first input impedance, when the bypass circuit is deactivated by the first control signal;
    a filter circuit electrically connected to the bias terminal, the filter circuit being configured to increase a second input impedance of the filter circuit viewed from the bias terminal, when a damping function of the filter circuit is activated by a second control signal, and configured to decrease the second input impedance, when the damping function is deactivated by the second control signal; and
    a control circuit configured to generate the first control signal and the second control signal for activating the damping function of the filter circuit when the control circuit activates the bypass circuit in accordance with the output voltage and for deactivating the damping function of the filter circuit when the control circuit deactivates the bypass circuit in accordance with the output voltage.

2. The optical receiver according to claim 1, wherein
    the filter circuit includes a field effect transistor (FET), a second resistor, a third resistor, and a capacitor,
    the second resistor has a first end electrically connected to the bias terminal,
    the FET has a gate, a drain, and a source,
    the gate of the FET is electrically connected to the control circuit and receives the second control signal,
    the source of the FET is electrically connected to a ground,
    the capacitor is electrically connected between the first end of the second resistor and the drain of the FET,
    the third resistor is electrically connected between the drain and the source of the FET, and
    the second impedance is decreased, when the FET comes into an on-state by setting a voltage of the second control signal to a larger value than a predetermined value, and is increased, when the FET comes into an off-state by setting the voltage of the second control signal to a smaller value than the predetermined value.

3. The optical receiver according to claim 1, wherein
    the filter circuit includes a field effect transistor (FET), a second resistor, a first capacitor, and a series circuit,
    the second resistor has a first end electrically connected to the bias terminal,
    the FET has a gate, a drain, and a source,
    the gate of the FET is electrically connected to the control circuit and receives the second control signal,
    the source of the FET is electrically connected to a ground,
    the first capacitor is electrically connected between the first end of the second resistor and the drain of the FET,
    the series circuit is electrically connected between the first end of the second resistor and the ground,
    the series circuit includes a third resistor and a second capacitor electrically connected to the third resistor in series, and
    the second input impedance is decreased, when the FET comes into an on-state by setting a voltage of the second control signal to a larger value than a predetermined value, and is increased, when the FET comes into an off-state by setting the voltage of the second control signal to a smaller value than the predetermined value.

4. The optical receiver according to claim 1, wherein
    the control circuit includes a first field effect transistor (FET), a second FET, a third FET, a fourth FET, a fifth FET, and a sixth FET, and a second resistor, a third resistor, a fourth resistor, and a fifth resistor, and a current source,
    each of the first FET, the second FET, the third FET, the fourth FET, the fifth FET, the sixth FET has a gate, a drain, and a source,
    the gate of the first FET receives a reference signal provided externally,
    the gate of the second FET is electrically connected to the control circuit and receives a signal generated in accordance with the output voltage,
    the source of the first FET is electrically connected to the current source through the second resistor,
    the source of the second FET is electrically connected to the current source through the third resistor,
    the drain of the third FET is electrically connected to a ground through the fourth resistor, and outputs the second control signal to the filter circuit,
    the drain of the fourth FET is electrically connected to the ground through the fifth resistor and outputs the first control signal to the bypass circuit,
    the drain of the first FET is electrically connected to the drain of the fifth FET and the gate of the third FET,
    the drain of the second FET is electrically connected to the drain of the sixth FET and the gate of the fourth FET, and
    the respective sources of the third FET, the fourth FET, the fifth FET, and the sixth FET are electrically connected to each other.

5. The optical receiver according to claim 1, wherein
the bypass circuit includes a field effect transistor (FET),
the FET has a gate and a drain,
the drain of the FET is electrically connected to the input terminal,
the gate of the FET is electrically connected to the control circuit and receives the first control signal from the control circuit.

6. A transimpedance amplifier circuit comprising:
a bias terminal configured to be electrically connected to a cathode of an external photodiode;
an input terminal configured to be electrically connected to an anode of the external photodiode and receive a current signal from the external photodiode;
an amplifier circuit having an input and an output, the amplifier circuit being configured to receive an input current through the input, to convert the input current to an output voltage, and to output the output voltage from the output;
a first resistor electrically connected between the input and output of the amplifier circuit;
a bypass circuit electrically connected to the input terminal, the bypass circuit being configured to decrease a first input impedance of the bypass circuit viewed from the input terminal and subtract a portion of the current signal from the current signal, when the bypass circuit is activated by a first control signal, and configured to increase the first input impedance, when the bypass circuit is deactivated by the first control signal;
a filter circuit electrically connected to the bias terminal, the filter circuit being configured to increase a second input impedance of the filter circuit viewed from the bias terminal, when a damping function of the filter circuit is activated by a second control signal, and configured to decrease the second input impedance, when the damping function is deactivated by the second control signal; and
a control circuit configured to generate the first control signal and the second control signal for activating the damping function of the filter circuit when the control circuit activates the bypass circuit in accordance with the output voltage and for deactivating the damping function of the filter circuit when the control circuit deactivates the bypass circuit in accordance with the output voltage.

\* \* \* \* \*